United States Patent [19]

Newton et al.

[11] Patent Number: 4,696,526

[45] Date of Patent: Sep. 29, 1987

[54] CARRIER FOR TAPE AUTOMATED BONDED SEMICONDUCTOR DEVICE

[75] Inventors: Edward L. Newton, Tempe; Steven D. Swendrowski, Chander, both of Ariz.

[73] Assignee: Intel Corporation, Santa Clara, Calif.

[21] Appl. No.: 759,657

[22] Filed: Jul. 26, 1985

[51] Int. Cl.$^4$ .............................................. H05K 1/00
[52] U.S. Cl. ................... 439/68; 174/52 FP; 439/347; 439/892
[58] Field of Search ............. 339/17 R, 17 C, 17 LC, 339/17 CF, 176 MP, 91 R; 357/69, 70, 74; 174/52 FP

[56] References Cited

U.S. PATENT DOCUMENTS

| Re. 30,604 | 5/1981 | Kowalski | 357/69 |
|---|---|---|---|
| 3,954,175 | 5/1976 | Mason | 339/17 CF |
| 4,007,479 | 2/1977 | Kowalski | 174/52 FP |
| 4,222,622 | 9/1980 | Griffin et al. | 339/17 CF |
| 4,519,658 | 5/1985 | Biswas | 339/17 CF |

FOREIGN PATENT DOCUMENTS

| 0107906 | 5/1984 | European Pat. Off. | 357/74 |
|---|---|---|---|
| 0071644 | 4/1983 | Japan | 357/74 |
| 0182255 | 10/1983 | Japan | 357/74 |

Primary Examiner—Gil Weidenfeld
Assistant Examiner—David Pirlot
Attorney, Agent, or Firm—Blakely, Sokoloff, Taylor & Zafman

[57] ABSTRACT

A carrier for holding a semiconductor device attached to a tape, said device being bonded to leads attached to the tape, said carrier having a base unit on which the tape is mounted, the base unit also having recessed located on the outer frame for aligning the carrier to punching die and other tools. The base unit also includes retractable latches that secure the tape to the base unit. Alignment posts on the base unit engage sprocket holes in the tape to align any test pads on the tape to the base unit; the alignment posts also align any plating bus nodes to a punching die for removal of the nodes while the tape is in the carrier. A cover is also provided to protect the tape; the legs of the cover engage receptacles in the base unit. The cover and base unit may be electrically conductive to protect against electrostatic discharge; the cover may further include conductive blades which short out leads on the tape to increase electrostatic discharge protection.

3 Claims, 7 Drawing Figures

CARRIER FOR TAPE AUTOMATED BONDED SEMICONDUCTOR DEVICE

BACKGROUND OF THE INVENTION

The present invention relates generally to the testing of semiconductor devices and more particularly to the characterization testing of tape automated bonded (TAB) semiconductor devices. The present invention also relates to the storage of semiconductor devices and particularly to the storage of tape automated bonded semiconductor devices.

There are various articles in the prior art which are used as carriers for semiconductor devices during testing or storage of such devices. In the pertinent prior art relating to carriers of tape automated bonded semiconductor devices, there are two categories of carriers. The continuous tape carrier is one such prior art device usually utilizing a reel-to-reel system. [See, for example, The Status of Tape Automated Bonding, O'Neill, Semiconductor International, Feb. 1981, pages 33-et. seq.] In the other category of test handling methods for tape automated bonding devices, the tape automated bonded device is mounted in a carrier similar to a 35 mm slide. Individual Carriers for TAB Integrated Circuit Assembly, John L. Kowalski, Proceedings of the 29th Electronics Components Conference, May 1979, pages 315-318. The handling method in which a tape is mounted in a carrier similar to a 35 mm slide is characterized by the tape being mounted on a base which has usually two split pins positioned to engage holes provided in the tape for the pins. The heads of the pins are larger than the holes in the tape thereby requiring the tape to be forced past the heads of the pins when inserting the tape onto the base of these carriers.

This slide method, despite such pins, does not locate the circuit test pads on the tape to any reference points on the carrier. Thus, it requires a more complex alignment procedure to test the semiconductor device. Also, the slide method does not lend itself to a test contactor having many leads or applying too much contact force, particularly at high temperatures (typically exceeding 150° C.). Finally, this slide method requires new mounting trackage to handle the slide in any of the test handlers presently available.

In the continuous tape testing method, it is difficult to do closely controlled high or low temperature testing. Such testing usually requires that the temperature be maintained by plus or minus 1° Centigrade (C.) during the test. Burn-in of tape automated bonded devices cannot be presently done on the continuous tape format because such equipment has not been developed. Neither the continuous tape handler nor the existing 35 mm slide carrier protects the semiconductor device from electrostatic discharge.

SUMMARY OF THE INVENTION

The present invention provides a carrier for holding a semiconductor device attached to a tape, which carrier includes a base unit which receives the tape and securely holds it by retractable latches which are usually an integral part of the base unit. The base unit includes alignment posts which engage sprocket holes in the tape to thereby align the tape with the base unit. Since the base unit has recesses located on the outer frame of the base unit, which recesses may be used by a test contactor, the test contactor probes can be accurately aligned with the test pads on the tape. The alignment posts on the base unit also serve to position the tape so that any plating bus node, which shorts out some or all of the leads on the tape automated bonded device, is positioned over openings in the base unit, which openings can accept a punching die so that the plating bus node can be punched out of the tape while the tape is in the carrier. Thus, rather than having to handle the tape manually to remove any plating bus nodes, the tape may be securely mounted in the carrier, which protects the device from electrostatic discharge, and then have its plating bus node(s) removed without additional possibilities of operator error during the manual removal of the plating bus nodes. Since the base unit has recesses, the punching die can be constructed so that it will engage the recesses and align itself to the carrier, accurately positioning the die over the opening which is below the plating bus node. The carrier may advantageously be designed to use the industry standard for perimeter outline design. For example, a 2 inch by 2 inch carrier could be used.

The present invention also provides a cover for protecting a tape, particularly during shipping of the tape automated bonding device, which cover has legs to engage receptacles in the base unit; these receptacles can advantageously be the same openings used to remove any plating bus node on the tape. The legs of the cover engage the base unit by having a lip that hooks onto the underside of the base unit thereby fastening the cover to the base unit. A conductive blade may be attached to the underside of the cover and positioned so that when the cover is placed over the tape on the base unit the conductive blade interconnects the leads which were previously shorted out by the plating bus node thereby again shorting out the leads. Thus, the cover may be used to prevent electrostatic discharge since all the leads may be held at the same potential. To test a device, the cover is removed thereby "opening" up the circuits for testing. It is advantageous that the base unit and the cover be made of a conductive plastic material to further protect the semiconductor device from electrostatic discharge. The base unit has an aperture which is at least larger than the perimeter of the semiconductor device and a portion of the leads extending from the device. The aperture is usually centrally disposed to surround the semiconductor device and a portion of the leads extending from the device such that by using an excising punching die, the device may be excised after testing has been completed. The excised device will include the device and a portion of the leads attached to the device but usually not the test pads. That is because the test pads are preferably placed outside of the perimeter of the aperture, thus permitting the application of greater pressure on the test pads by a test contactor. Normally, the tape itself has been etched away in the immediate vicinity of the device, prior to bonding the device to the leads; consequently, the excised device does not include any tape in typical processing.

Thus, the present invention provides a handling medium for the burn-in and low/high temperature sort testing of single tape automated bonded devices, before finally packaging, by existing test handling equipment used in the semiconductor industry (if the industry standard for the perimeter outline of the carrier is used). The carrier also provides for protection against physical damage and electrostatic discharge of the device. The following detailed description, together with the drawings, will illustrate by way of example the features and advantages of the present invention.

DETAILED DESCRIPTION OF THE INVENTION

Figure 1:
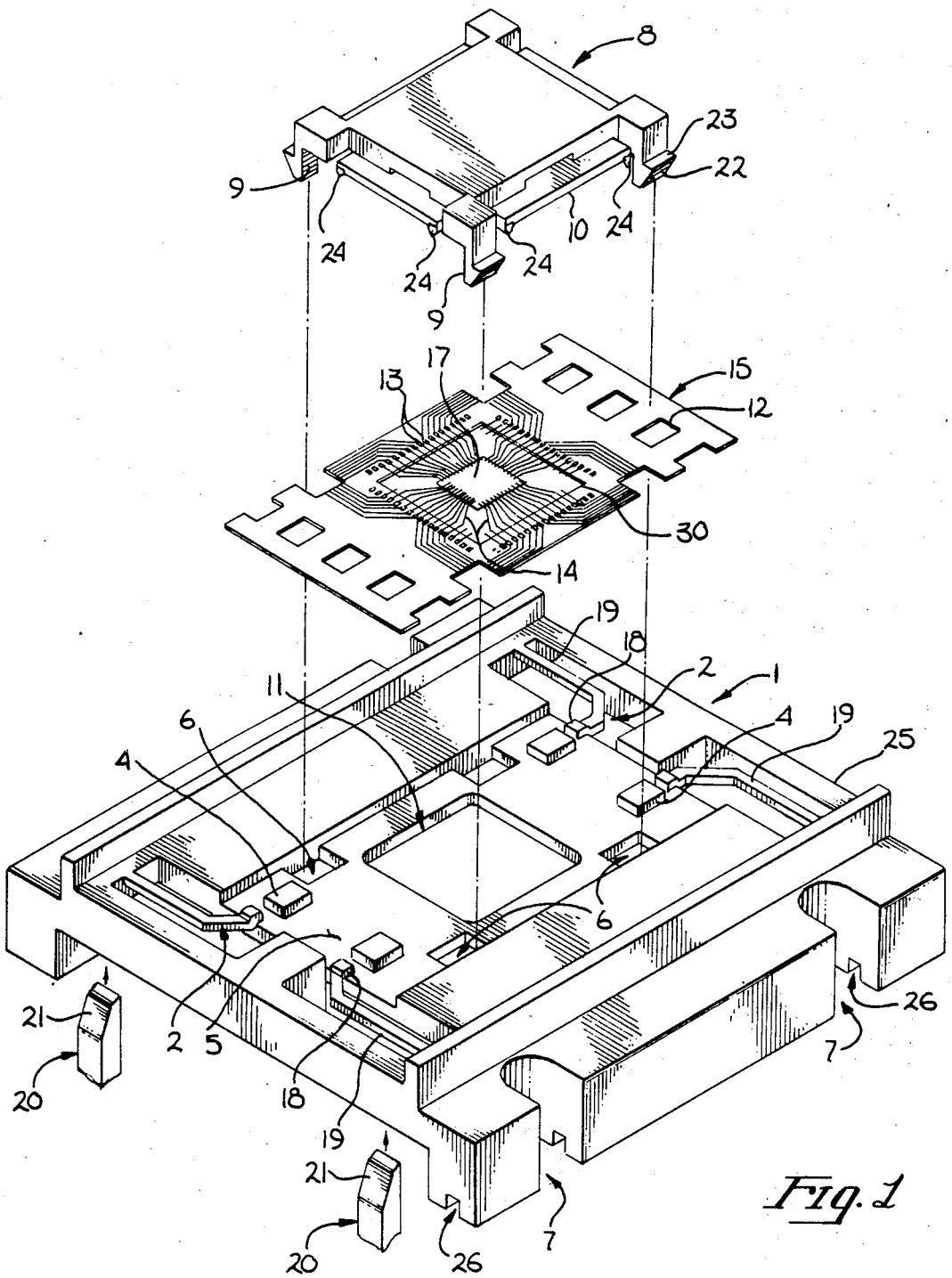
FIG. 1 is a perspective view of the carrier assembly, showing the base unit 1, the tape 15, having a tape automated bonded semiconductor device attached thereto, and the cover 8.
Figure 3:
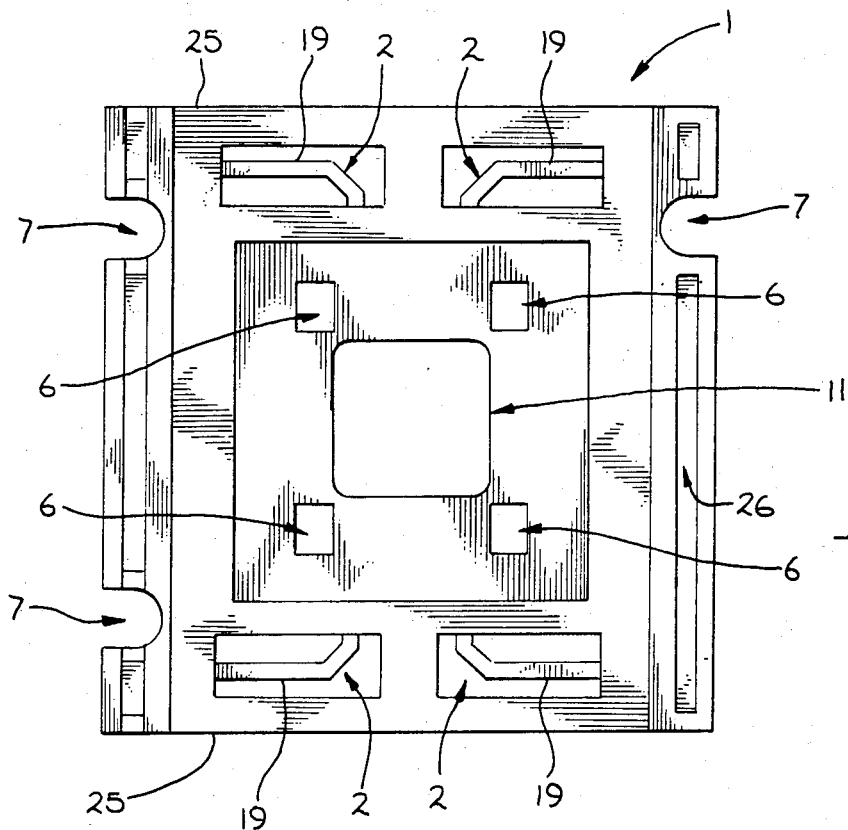
FIG. 3 shows the underside of the base unit 1.

Referring to FIGS. 1 and 3, a base unit 1 has an outer frame 25 and a seating plane 5. As shown in FIG. 1, there are three recesses (7) in the outer frame 25 of the base unit 1. These recesses, along with the track groove 26, may be used to position the base unit with respect to handling equipment (e.g., a punching die) so that the various parts of the handling equipment can be aligned with respect to the tape 15.

The base unit 1 is designed to accept a tape to which a semiconductor device is attached. The semiconductor device 17 has conductive contacts, usually consisting of metal, which are bonded to leads 14 attached to the tape 17. Usually, the leads 14 are etched out, based on a pattern, onto the tape. For a further discussion of the tape automated bonding process see *Semiconductor International,* February 1981, pages 33-et.seq and references noted therein. The semiconductor device 17, sometimes referred to as a semiconductor die, is usually a portion cut out from a wafer, on which portion there is an integrated circuit or circuits. The phrase "semiconductor device" as used to describe and claim this invention, means any semiconductor apparatus or device, including discrete components or integrated circuits, such as a microprocessor.

Figure 2:
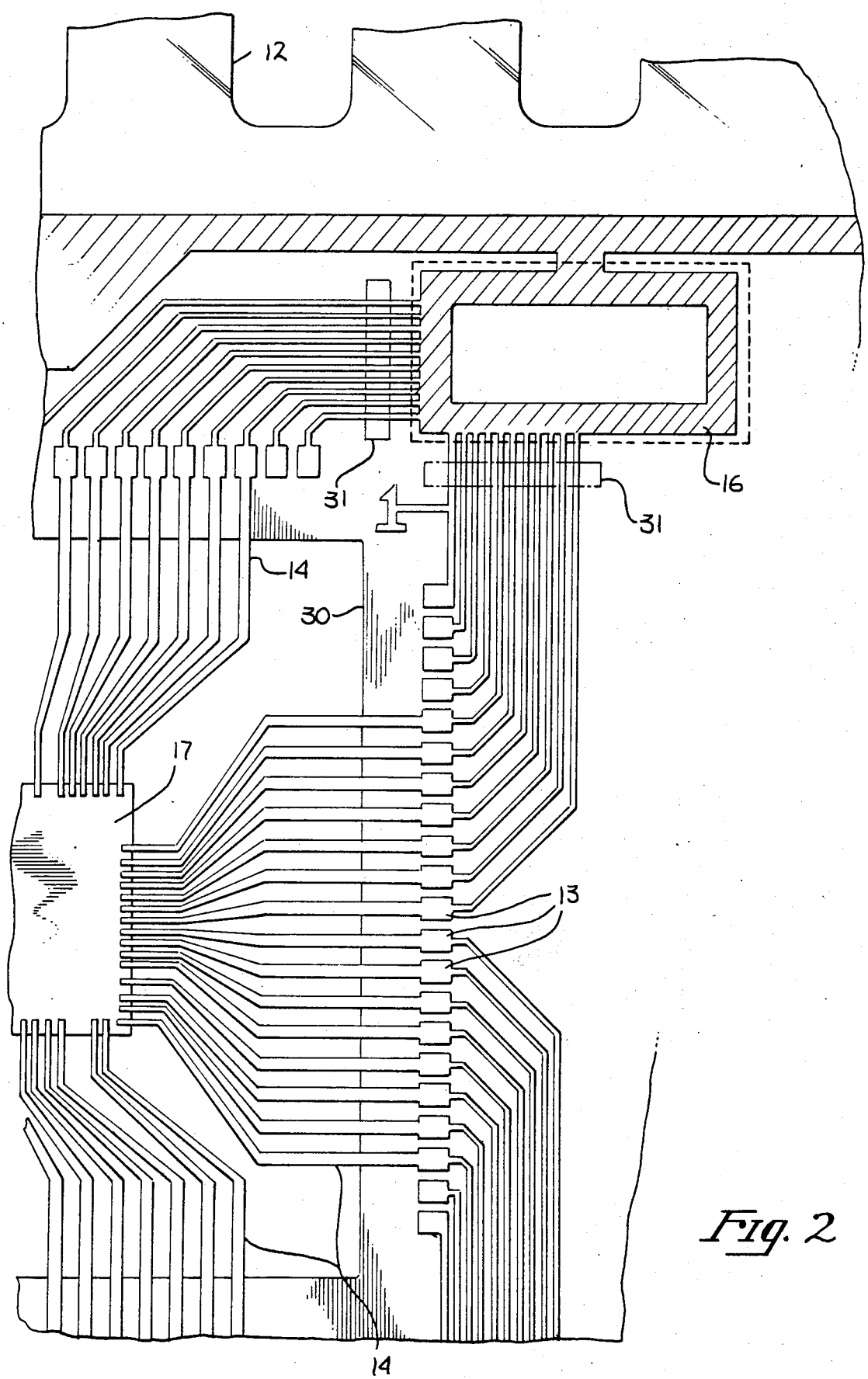
FIG. 2 is a partial, top view of a tape bonded to a device used in the tape automated bonding process.

Once the semiconductor device 17 is bonded via the tape automated bonding process to the tape, circuits in the semiconductor device are coupled to the test pads 13 on the tape 15 via the conductive leads 14 which have been etched out on the tape 15. Normally, the tape is removed during the tape automated bonding process, in the region defined by the rectangle 30; thus, only the device 17 and its attached leads 14 are located within the rectangle 30. Referring to FIG. 2, which shows a portion of a tape used for the tape automated bonding process, it can be seen that the process, at least for certain tape designs requires that the leads 14 be interconnected by a conductive plating bus node 16. Prior to any testing of the semiconductor device 17 which is coupled to the leads 14, the plating bus node 16 must be removed since, as can be seen, it shorts out various leads 14. It will be understood that this shorting out serves a useful purpose in that it prevents electrostatic discharge from destroying the semiconductor device 17.

Returning now to FIGS. 1 and 3, the base unit 1 has an aperture 11, usually centrally disposed on the seating plane 5, which aperture is positioned below the area of the tape automated bonded device where the semiconductor device 17 and a portion of the leads 14 are attached. The perimeter of the aperture 11 is larger than the semiconductor device 17 and a portion of the leads 14 attached thereto. Thus, when the semiconductor 17 is attached to the tape 15 mounted on the seating plane 5, the perimeter of the aperture 11 surrounds the semiconductor device 17. Preferably, the test pads 13 are placed outside of the perimeter of the aperture 11. Note that the test pads 13 are also placed outside of the rectangle 30 on the tape 15; thus, the test pads 13, being supported by the tape 15 and the seating plane 5 of the base unit 1, can accept a test contactor having many test probes placing much pressure on the test pads 13.

Appearing on the top (or upper) surface of the seating plane 5 are alignment posts 4 which are sized to fit sprocket holes 12 in the tape 15. These alignment posts 4 serve to align the tape 15, and consequently the test pads 13 located on the tape 15, to the base unit 1. This alignment is accomplished since the sprocket holes 12 occupy a standard position along said tape, usually along opposite sides of the tape 15. To mount the tape 15 on the seating plane 5 of the base unit 1, one must retract the retractable latches 2 which are attached to the base unit 1.

The retractable latches 2 have a tip 18 that, when the latch is not retracted sit on top of the seating plane; the tip 18 closely abuts the top of the seating plane 5 and, consequently, the tape 15 when it is placed on the seating plane 5. An arm 19 of the retractable latch 2 is attached to the base unit 1 and to the tip 18. The arm is flexible and hence permits the retractabable latch 2 to be retracted up from the seating plane 5 and away from the seating plane towards the outer edges of the base unit 1. The retraction of the retractable latches 2 may be accomplished by a latch retractor 20 which has a latch cam surface 21 that engages the arm 19 pushing that arm up and towards the outer frame 25 of the base unit 1. As shown in FIG. 1, the latch retractor 20 is pushed up, towards the underside of the base unit 1. and towards the arm 19. When the latch cam surface 21 forces the arm up above the seating plane 5 and pushes it outwardly towards the outer frame 25. Normally, all four latches are retracted simultaneously by using four latch retractors positioned on a carriage to engage the four latches when the retractors are moved towards the underside of the base unit 1. When all four retractable latches 2 have been retracted as described, the tape 15 may be laid upon the seating plane 5. The sprocket holes 12 engage the various alignment posts 4 that may be on the seating plane 5, thus aligning the tape 15 with the base unit 1. Of course, if desired one or any number of latches may be used instead of four latches.

It should be understood that when the tape is first placed into the base unit 1, the plating bus node 16 is usually on the tape 15. Thus, the semiconductor device 17, attached to the tape 15 when the tape is inserted into the base unit 1, cannot be tested until the shorts caused by the plating bus node(s) 16 are removed. Usually, a tape 15 will have 4 plating bus nodes 16 which must be removed prior to testing of the semiconductor device 17.

In the prior art, such plating bus nodes were removed prior to placing the tape in a carrier for testing. The present invention permits the plating bus nodes 16 to be removed while the tape 15 is securely and safely held in the base unit 1. The seating plane 5 has an opening or openings 6 which are positioned immediately below any plating bus nodes 16 on the tape 15 when tape 15 is aligned to the base unit 1. The alignment posts 4 serve to align the plating bus node on the tape 15 with the openings 6 in the seating plane. The openings 6 are sized to accept a punching die that may be used to remove the plating bus node 16. The punching die would normally have tabs which are designed to engage the recesses 7 in the base unit thereby properly positioning the punching die with respect to the openings 6. The punching die may also utilize the track groove 26 to align itself with the openings 6. Normally, the punching die would have the same number of punches as there are of openings 6; therefore, all of the plating bus nodes 16 immediately above openings 6 would be simultaneously removed.

Once the plating bus node(s) 16 has (have) been removed, the semiconductor device 17 may be tested. The carrier can be loaded into a custom burn-in socket utilizing the three recesses 7 to assure proper alignment with the test contact pins to the test pads 13. It is advantageous, in order to allow testing at various temperatures and to provide electrostatic discharge protection, to use poly-ether-sulfone with 7% graphite (PES-7) as the compound for molding the base unit 1. This compound is available from Alpha Modular Systems in San Diego, Calif.

Referring now to FIGS. 1, 4, 5 and 6, it will be seen that the present invention also provides for a cover that serves to protect the tape during storage and/or shipping of the carrier with the tape therein. The cover 8 has legs 9 that engage receptacles in the seating plane 5 thereby allowing the cover to be secured to the base unit 1. Normally, there are four legs 9 positioned at the four corners of the rectangular cover 8. It is advantageous to use the openings 6 as the receptacles for the legs 9. Each leg 9 has an angled surface 22 at the bottom of the leg, which angled surface extends beyond the opening or receptacle which is sized to fit the leg when the legs 9 are preparatorily positioned over the receptacles. The legs 9 cannot be fitted into the receptacles unless they flex inwardly by the action of the angled surface 22 on the receptacle, which is usually the opening 6. That is, the distance between the outer edges of two angled surfaces 22, facing opposite directions and on opposite sides of the cover, exceeds the distance between the outer edges of the corresponding receptacles. Once fully inserted, the legs 9 spring back into their normal position, which is perpendicular to the seating plane, and the lip 23 on each leg 9 engages the underside of the seating plane 5 thereby securing the cover 8 to the base unit 1.

The cover 8 may have a conductive blade 24 attached to the underside of the cover and positioned so that when the cover is secured in place over the tape 15 and secured onto the base unit 1, the conductive blade 24 interconnects the leads 14 thereby shorting them out just as the plating bus node 16 did. It will be appreciated that the conductive blade causes the leads thereby shorted out to be at the same potential and helps to prevent electrostatic discharge of the semiconductor device 17. As shown in FIG. 2, the conductive blade 24 is positioned to contact the area 31 where a series of leads 14 run towards the location where the plating bus node 16 was before it was punched out. Of course, if desired, only a few of the leads may be shorted out.

Figure 4:
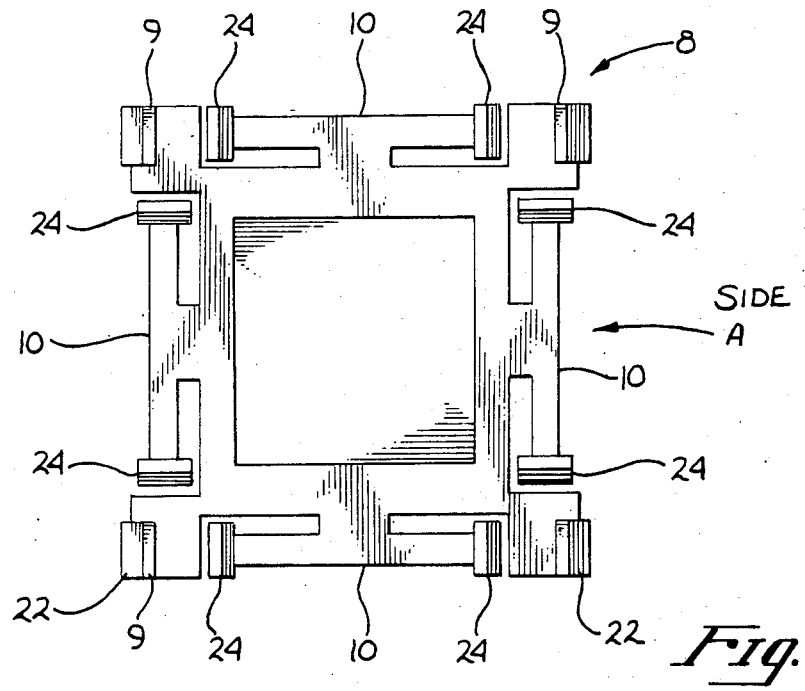
FIG. 4 shows the underside of the cover 8.
Figure 5:
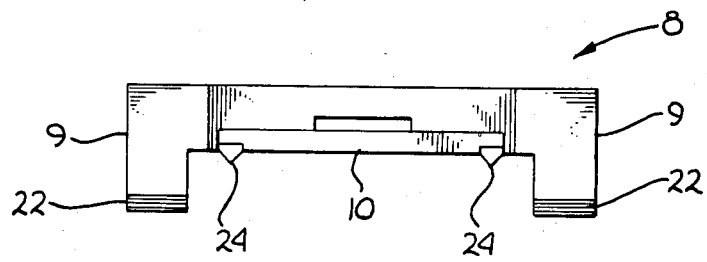
FIG. 5 is a side view, taken of side A in FIG. 4, of the cover 8.
Figure 6:
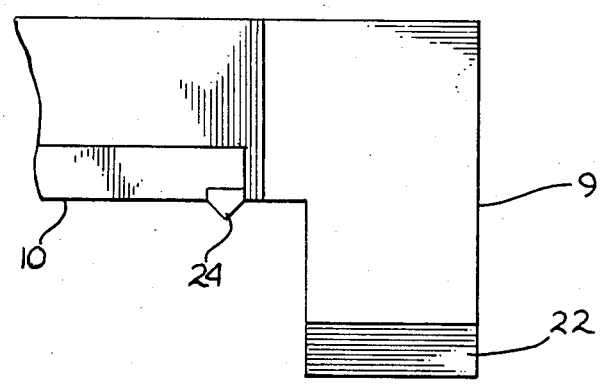
FIG. 6 is an enlarged, partial view of the cover shown in FIG. 5.

As shown in FIGS. 1, 4 and 5, the cover 8 may advantageously have a series of conductive blades 24 located on wings 10 which are positioned around the sides of the rectangle which forms the main part of the cover 8. The wings 10 may be spring-loaded to give better contact to the area 31; by securing the wing 10 with a hinge allowing limited angular movement, and by placing a spring, between the underside of the cover and the wing 10, the wing 10 and hence the blade 24 will be forced toward the area 31 to short out a series of leads 14. As with the base unit 1, the cover 8, wings 10, and conductive blades 24 are preferably made with a plastic conductive material such as PES-7 (poly-ether-sulfone with 7% graphite). Consequently, all conductive blades 24 on the cover 8 will be at the same potential and will short out all leads 14 making them at the same potential.

Figure 7:
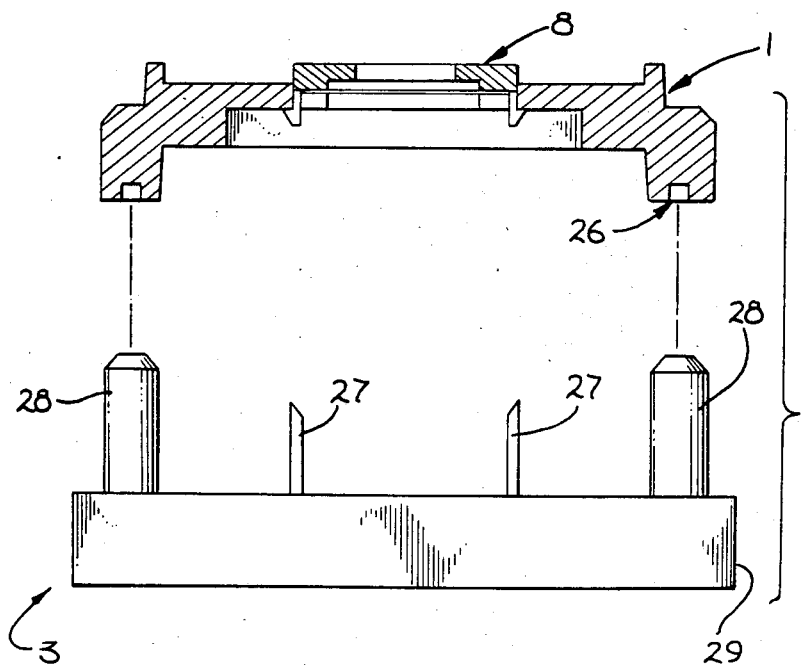
FIG. 7 is a cross-sectional view of the carrier assembly, assembled, with the cover removal fixture preparatorily positioned to disengage the cover from the assembly.

The cover 8 may be removed by the cover removal fixture shown in FIG. 7. Rods 27 positioned to match the legs 9 of the cover 8 may be pushed, from the underside of the base unit, into contact with each of the legs 9. The rods 27 are fixed to a carriage 29 having dowels 28. The top edge of each rod is angled to match the angled surface 22 of the legs 9. The cover removal fixture is aligned with the base unit and hence the cover 8 by dowels 28 that fit into the recesses 7 of the outer frame of the base unit 1. The rods 27 when pushed onto the legs 9 cause the legs 9 to flex inwardly thereby allowing the lip 23 to clear the receptacle, which as shown in the drawings is the same as the openings 6.

A fixture similar to the one shown in FIG. 7 may be utilized to retract the retractable latches 2. In particular, the latch retractors 20 may be positioned on a carriage similar to the carriage 29 shown in FIG. 7; the positioning of the latch retractors 20 would of course be such as to engage their respective retractable latches 2. This can be assured by again using a dowel to engage the recesses, such as the dowel 28 shown in FIG. 7, to align the latch retractors 20 with the retractable latches 2.

Once the various tests of the semiconductor device 17 have been completed, the device 17 may be removed from the tape while it is in the carrier. First, the cover 8 is removed as described above. Then, an excising punch is used to remove the semiconductor device 17 and a portion of the leads 14 attached to it, which portion of leads 14 should be within the rectangle 30 in FIGS. 1 and 2. The rectangle 30 is normally immediately above the aperture 11 in the seating plane 5. The aperture 11 provides clearance for the excising punch which is aligned within close tolerance to the device by utilizing the recesses 7 on the base unit 1. The excising punch uses the recesses 7 to position the excising punch directly over the aperture 11. The excising punch section of an outer lead bonding machine may be used for the removal of the semiconductor device 17 and its associated portion of the leads 14. It is understood that the leads 14 which are excised with the semiconductor device 17 will be used to bond the semiconductor 17 to its final package.

The base unit may be constructed to match the industry standard perimeter dimensions (e.g., 2 inch by 2 inch). This will permit the use of conventional testing equipment with the tape automated bonded device in such a base unit.

From the foregoing, it will be apparent that this invention comprises an improved handling method having several advantages over the prior art. This carrier allows complete testing of the semiconductor device it contains by conventional equipment used in the semiconductor industry. In addition it provides mechanical and electrical protection not found in the prior art.

Other advantages will be evident to those skilled in the art.

While a particular form of the invention has been illustrated and described, it will be apparent that other modifications can be made without departing from the spirit and scope of the invention as defined by the following claims.

We claim:

1. A carrier for holding a semiconductor device attached to a tape during testing of said semiconductor device, said device being bonded to leads attached to said tape, said leads being coupled to test pads, located on said tape, for making contact to circuits in said semiconductor device, said carrier comprising:

a base unit having a seating plane on which said tape is mounted, said base unit having recesses located on the outer frame of said unit for aligning a punching die with said base unit and portions thereof;

at least two retractable latches on said base unit, each of said latches having a tip that abuts the top of said tape when said latch is not retracted and when said tape is mounted on said seating plane so that said latch secures said tape against said seating plane, each of said latches having an arm connected to said tip, said arm being attached to said base unit and being flexible so that said latch may be retracted thereby lifting said tip off said tape permitting said tape to be removed from said carrier; and at least two alignment posts protruding from said seating plane, said alignment posts engaging sprocket holes in said tape to align said tape to said base unit so that a plating bus node on said tape, which plating bus node couples at least some of said leads, is aligned over an opening in said seating plane, said opening accepting said punching die so that said plating bus node can be punched out of said tape while said tape is in said carrier thereby making said circuits available for testing;

a cover for protecting said device, said cover having at least two legs to engage receptacles in said seating plane, said legs being positioned to engage said receptacles and having means to secure said legs to said base unit, and a conductive blade attached to the underside of said cover and positioned so that when said cover is placed over said tape on said base unit, said conductive blade interconnects at least some of said leads, thereby shorting out some of said leads;

whereby, said carrier protects said semconductor device against physical damage and damage by electrostatic discharge.

2. A carrier as defined by claim 1 wherein said base unit is composed of a conductive plastic material and said cover and conductive blade are composed of a conductive plastic material and wherein said base unit has four openings and four receptacles and said receptacles are the same as said openings and wherein said cover has four legs.

3. A carrier as defined by claim 2 wherein said base unit has four retractable latches and four alignment posts and three recesses and wherein said conductive material is poly-ether-sulfone with 7% graphite.

* * * * *